United States Patent
Hashimoto et al.

(10) Patent No.: US 6,794,248 B2
(45) Date of Patent: Sep. 21, 2004

(54) METHOD OF FABRICATING SEMICONDUCTOR MEMORY DEVICE AND SEMICONDUCTOR MEMORY DEVICE DRIVER

(75) Inventors: Tatsuya Hashimoto, Fukushima (JP);
Toshiyuki Maenosono, Fukushima (JP);
Taiji Togawa, Fukushima (JP);
Takayuki Enda, Fukushima (JP);
Hideo Takagi, Fukushima (JP)

(73) Assignee: Fujitsu Amd Semiconductor Limited, Fukushima (JP)

( * ) Notice: Subject to any disclaimer, the term of this patent is extended or adjusted under 35 U.S.C. 154(b) by 0 days.

(21) Appl. No.: 10/279,981

(22) Filed: Oct. 25, 2002

(65) Prior Publication Data
US 2003/0162354 A1 Aug. 28, 2003

(30) Foreign Application Priority Data
Feb. 26, 2002 (JP) .................................... 2002-049438

(51) Int. Cl.[7] ............................................ H01L 21/336
(52) U.S. Cl. .................... 438/258; 438/257; 438/275; 438/279
(58) Field of Search ................................ 438/257, 258, 438/275, 279

(56) References Cited

U.S. PATENT DOCUMENTS

| 4,581,622 | A | * | 4/1986 | Takasaki et al. | ........ 365/185.32 |
| 5,742,094 | A | * | 4/1998 | Ting | ............................ 257/620 |
| 5,767,544 | A | * | 6/1998 | Kuroda et al. | .............. 257/318 |
| 5,883,001 | A | * | 3/1999 | Jin et al. | ..................... 438/624 |
| 6,350,651 | B1 | * | 2/2002 | Wada et al. | ................. 438/257 |
| 6,475,895 | B1 | * | 11/2002 | Mei et al. | .................... 438/597 |
| 6,727,143 | B1 | * | 4/2004 | Hui et al. | ................... 438/256 |

* cited by examiner

*Primary Examiner*—John F. Niebling
*Assistant Examiner*—Jennifer M. Kennedy
(74) *Attorney, Agent, or Firm*—Westerman, Hattori, Daniels & Adrian LLP (57) ABSTRACT

Disclosed is a method of fabricating a semiconductor memory device including the step of irradiating ultraviolet rays on a metal interconnection at a bonding pad part, so that the metal interconnection can be prevented from being corroded because of a corrodent element in the process of erasing charges stored in a charge storage part. An oxide coating film is formed on the surface of the metal interconnection at the bonding pad part, and ultraviolet rays are irradiated onto the oxide coating film for erasing of charges from the floating gate.

9 Claims, 12 Drawing Sheets

METHOD OF FABRICATING SEMICONDUCTOR MEMORY DEVICE AND SEMICONDUCTOR MEMORY DEVICE DRIVER

CROSS-REFERENCE TO RELATED APPLICATIONS

This application is based upon and claims priority of Japanese Patent Application No. 2002-049438, filed on Feb. 26, 2002, the contents being incorporated herein by reference.

BACKGROUND OF THE INVENTION

1. Field of the Invention

The present invention relates to a method of fabricating a semiconductor memory device and a semiconductor memory device, and more particularly to a method of fabricating a non-volatile semiconductor memory device having the step of erasing charges cumulated in a charge storage part such as a floating gate by irradiating ultraviolet rays onto the surface of a metal wiring line of a bonding pad and such a semiconductor memory device.

2. Description of the Related Art

Semiconductor memories using MOSFETs (Metal Oxide Semiconductor Type Field Effect Transistor) are generally used for storing digital data. Among these semiconductor memories, an EEPROM (Electrically Erasable Programmable Read Only Memory) and a flash memory, which are electrically programmable ROMs, are used to store the program code of the cellular phone and a system BIOS (Basic Input Output System) of the mother board of the personal computer (PC).

The programmable ROMs as described above have the structure of storing information by accumulating charges in a charge storage part such as a floating gate.

It is known that hot electrons occur due to plasma used in the etching or ashing step of the process for fabricating the semiconductor memory devices with the floating gates and charges resulting from the hot electros are injected in the floating gate. This may cause a memory malfunction. Further, if too many charges are stored, an insulating film that is in contact with the floating gate may be destroyed. In order to avoid these problems, the fabrication process is additionally provided with the step of erasing the charges stored in the floating gate by ultraviolet rays.

In the fabrication process for the general semiconductor memory devices including the programmable ROMs, it is known that a multilayer metallization is formed by the combination of deposition of a thin insulation or metal film, resist deposition, pattern transfer by photolithography, selective thin film removal by etching, and resist removal. Memory elements are formed by the combination of the multilayer metallization fabrication technique and MOS transistor fabrication technique. Further, the memory elements are packaged in order to prevent age deterioration of the memory elements function and implement the input/output function. In order to interconnect the input/output terminals of the package and the memory input/output signals on the semiconductor substrate, bonding pads electrically coupled with the memory elements formed on the substrate are formed.

However, the conventional fabrication method has the following problems. As has described, the final step on the substrate is to form the bonding pads. Thereafter, the charges stored in the floating gates are erased by irradiation of ultraviolet rays. In the step of forming the bonding pad parts, dry ashing such as plasma ashing using oxygen-based gas is employed to remove the resist. Then, wet ashing is performed using solution that contains hydroxylamine in order to completely remove the resist. During the above process, the metal oxide film formed on the metallization is removed, so that the metallization is exposed.

In this case, chlorine (Cl) and another ion are deposited on the metallization exposed during the etching process for the bonding pad parts, and react with moisture in the atmosphere. This causes corrosion of the aluminum metallization after etching. For example, corrosion occurs by the following reaction: $Al+4CL^- \rightarrow AlCl_4^- +3e^-, AlCl_4^- +3H_2O \rightarrow Al(OH)_3 +3H^+ +4Cl^-$.

Even in the clean room, the density of Cl may exceed a reference situation in which the wafer may be contaminated so that ions of $300 \times E10$ [molecule/cm$^2$] have been deposited thereon after it remains for 24 hours in the uncontrolled state. Further, the solution for use in wet ashing may contain slight Cl. These factors may cause corrosion.

Furthermore, corroding may be enhanced by such a mechanism that Cl$^-$ ions and a reaction product deposited on the wafer by the resist removal apparatus and from another environment until the process of removing the charges stored in the floating gates by ultraviolet rays after the etching process for the bonding pad parts react with oxygen in the atmosphere with high optical energy of ultraviolet rays being used as activation energy when irradiating.

SUMMARY OF THE INVENTION

Taking into consideration the above, an object of the present invention is to provide a method of fabricating a semiconductor memory device capable of preventing metallization from being corroded and such a device.

To accomplish the above object, there is provided a method of fabricating a semiconductor memory device having a step of irradiating ultraviolet rays onto a metal interconnection at a bonding pad part and thus erasing charges stored in a charge storage part, the method further comprising the steps of: forming a protection film on a surface of the metal interconnection; and irradiating the ultraviolet rays onto the protection film and thus erasing the charges.

The above object of the present invention is also accomplished by a semiconductor memory device fabricated by irradiating ultraviolet rays onto a metal interconnection at a bonding pad part and thus erasing charges stored in a charge storage part, the semiconductor memory device comprising a protection film on a surface of the metal interconnection.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

A description will now be given of embodiments of the present invention with reference to the accompanying drawings.

Figure 1:
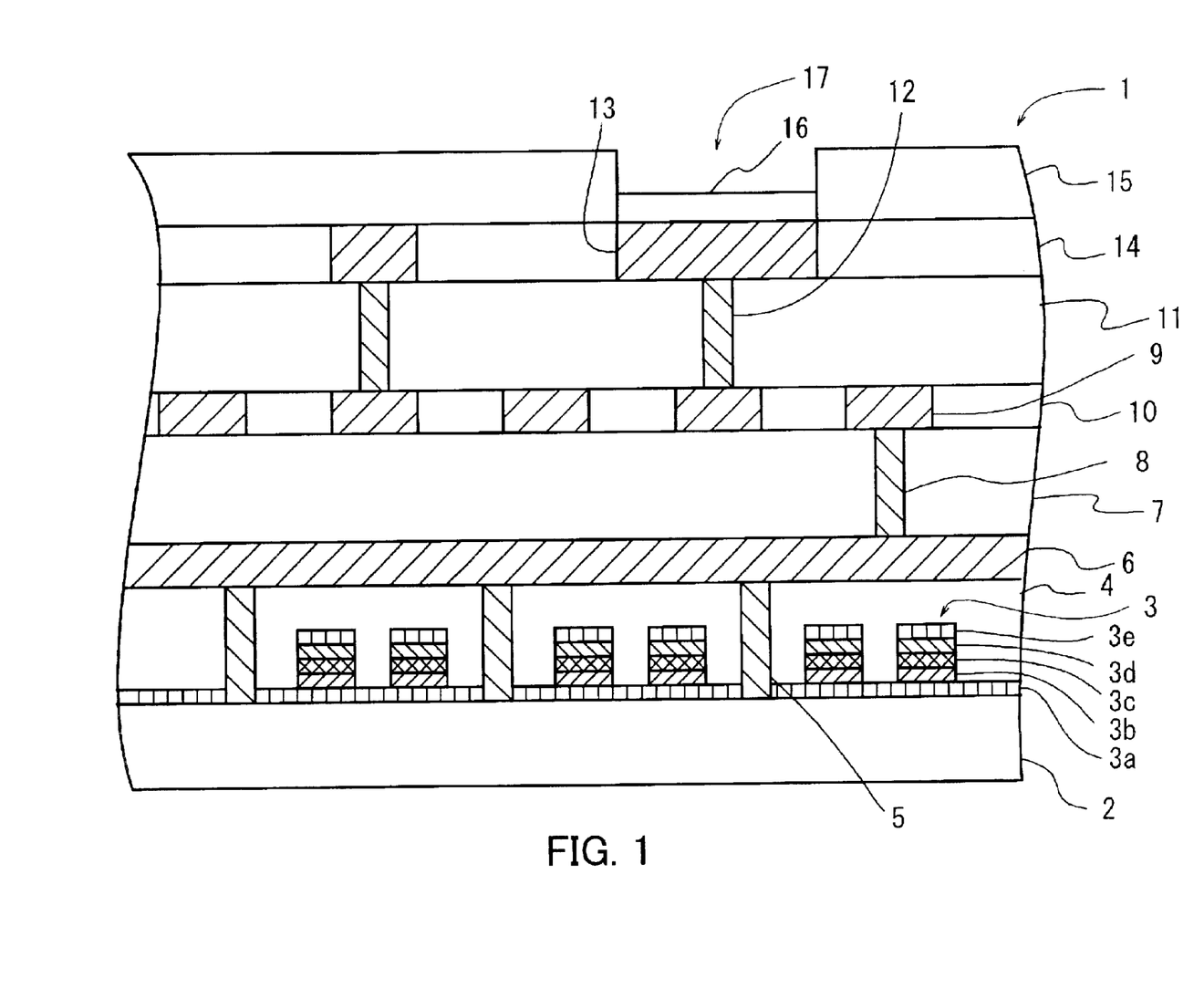
FIG. 1 is a view of a structure of a semiconductor memory device of the present invention.

FIG. 1 shows a structure of the semiconductor memory device of the present invention. The semiconductor memory device that is assigned to a reference numeral of 1 in FIG. 1 has a structure of the flash memory.

The structure of the semiconductor memory device 1 is described. Gates 3 are formed on a silicon (Si) substrate 2, and a film 4 for flattening is formed so as to cover the gates 3. Via wirings 5 are formed for making connections between the silicon substrate 2 and a metal interconnection 6. An interlayer insulating film 7 is formed on the metal interconnection 6. A via wiring 8 is formed to electrically connect the metal interconnection 6 and a metal interconnection 9 located above the interconnection 6. A film 10 for flattening is formed on the interlayer insulating film 7 so as to cover the metal interconnection 9. Another interlayer insulating film 11 is formed on the flattening film 10, and a via wiring 12 is formed to electrically connect the metal interconnection 9 and an upper metal interconnection 13. A film 14 for flattening is formed on the interlayer insulating film 11 so as to cover the metal interconnection 13. A passivation film 15 is formed on the flattening film 14 and is opened at a bonding pad part 17. An oxide coating film 16 is formed on the interconnection 13 at the bonding pad part 17.

The via wirings 5, 8 and 12 are made of tungsten (W), and the films 4, 10 and 14 for flattening are SOG (Spin On Glass), HSQ (Hydrogen Silse Quioxane) or BPSG (Boron PhosphoSilicate Glass). The interconnections 6, 9 and 13 are made of aluminum (Al), copper (Cu), gold (Au), platinum (Pt) or W. The interlayer insulating films 7 and 11 are silicon oxide films formed by CVD (Chemical Vapor Deposition). The passivation film 15 is a silicon nitride film. The oxide coating film 16 is formed by oxidizing the metal interconnection 13. When the interconnection 13 is made of Al, the film 16 is an aluminum oxide.

Each of the gates 3 has a structure such that a tunnel oxide film 3a, a floating gate 3b, an insulating film 3c, a control gate 3d and an electrode 3e are stacked on the surface of the silicon substrate 2 in that order. The floating gate 3b may be made of polysilicon, and stores charges by the hot carriers and tunneling effect so that information can be memorized. The control gate 3d may be made of polysilicon, and the electrode 3e may be tungsten silicide (WSI).

Preferably, the oxide coating film 6 formed on the metal interconnection 13 at the bonding pad part 17 is 3.0 nm thick or more.

By forming the oxide coating film 16 on the surface of the metal interconnection 13 at the bonding pad part 17, it becomes possible to prevent Cl and Cl⁻ ions from being deposited on the metal interconnection 13 and to prevent occurrence of corrosion.

In order to erase the charges injected in the floating gate 3b at the stage of plasma etching or the like, ultraviolet rays are irradiated onto the metal interconnection 13 at the bonding pad part 17. During irradiation, the surface of the metal interconnection 13 is protected by the oxide coating film 16, so that an element and ionic species that accelerate corrosion of Cl and Cl⁻ ions can be prevented from being deposited. Thus, corrosion can be avoided even in the process of irradiating ultraviolet rays that facilitates the occurrence of corrosion.

The films 4, 10 and 14 for flattening are not limited to SOG, HSQ or BPSG. It is to be noted that it is preferable to employ an insulating film that has a relatively low relative permittivity in order to reduce the wiring capacitance.

Nitride film may be substituted for the oxide film 16 that is obtained by oxidizing the metal interconnection 13 and serves as the protection film on the metal interconnection 13 at the bonding pad part 17.

A description will now be given of the method of fabricating the semiconductor memory device according to an embodiment of the present invention.

Figure 2:
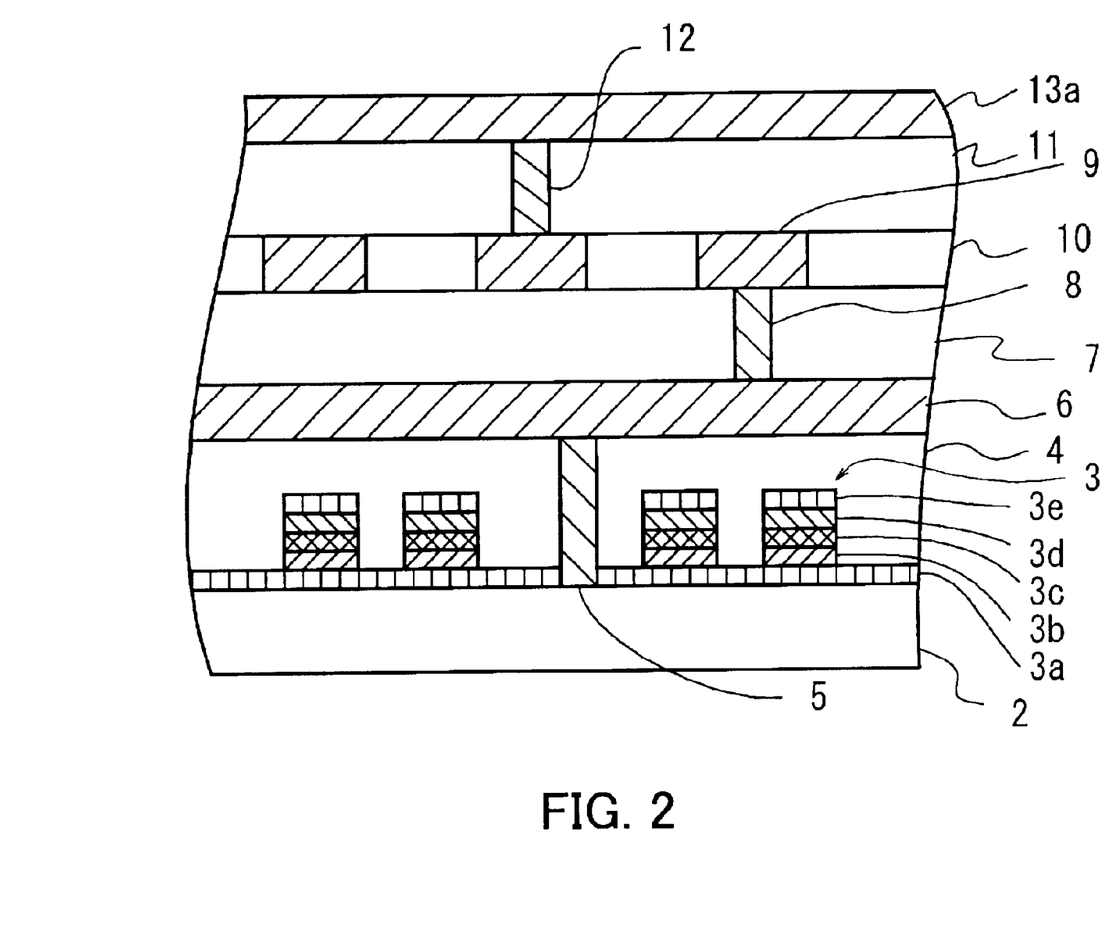
FIG. 2 is a view of a part of the method of fabricating the semiconductor memory device wherein a bonding pad part and metallization that is patterned into a metal interconnection.

FIG. 2 shows a part of the process for fabricating the semiconductor memory device, in which the bonding pad part and growth of the metal interconnection are depicted.

Referring to FIG. 2, The gates 3 are formed on the silicon substrate 2, and the film 4 for flattening is formed so as to cover the gates 3. The via wiring 5 for connection between the silicon substrate 2 and the metal interconnection 5 is formed. The interlayer insulating film 7 is formed on the metal interconnection 6. The via wiring 8 is formed to electrically connect the metal interconnection 6 and the metal interconnection 9 located above it. The film 10 for flattening is formed on the interlayer insulating film 7 so as to cover the metal interconnection 9. The interlayer insulating film 11 is formed on the flattening film 10, and the via wiring 12 for electrically connecting the metal interconnection 9 and the upper wiring is formed. The gate 3 has the structure in which the tunnel oxide film 3a, the floating gate 3b, the insulating film 3c, the control gate 3d and the electrode 3e are stacked in that order from the surface of the silicon substrate 2. The floating gate 3b may be polysilicon. The charges are stored in the floating gates 3b by hot carriers and tunnel effect so that the storage function can be implemented. The control gate 3d may be polycide, and the electrode 3e is W.

The above-mentioned layer structure can be formed by the photolithography technique.

The process shown in FIG. 2 is to grow metal interconnection substance 13a for interconnection on the interlayer insulating film 11.

The metal interconnection substance 13a is Al with Cu slightly added in order to improve electromigration (EM)

and stressmigration (SM). The metal interconnection substance 13a may be grown by CVD. In order to prevent exposure reflection, titanium (Ti) or titanium nitride (TiN) may be sandwiched between Al layers, or TiN or W serving as barrier metal may be formed below the Al film or additionally thereon.

Figure 3:
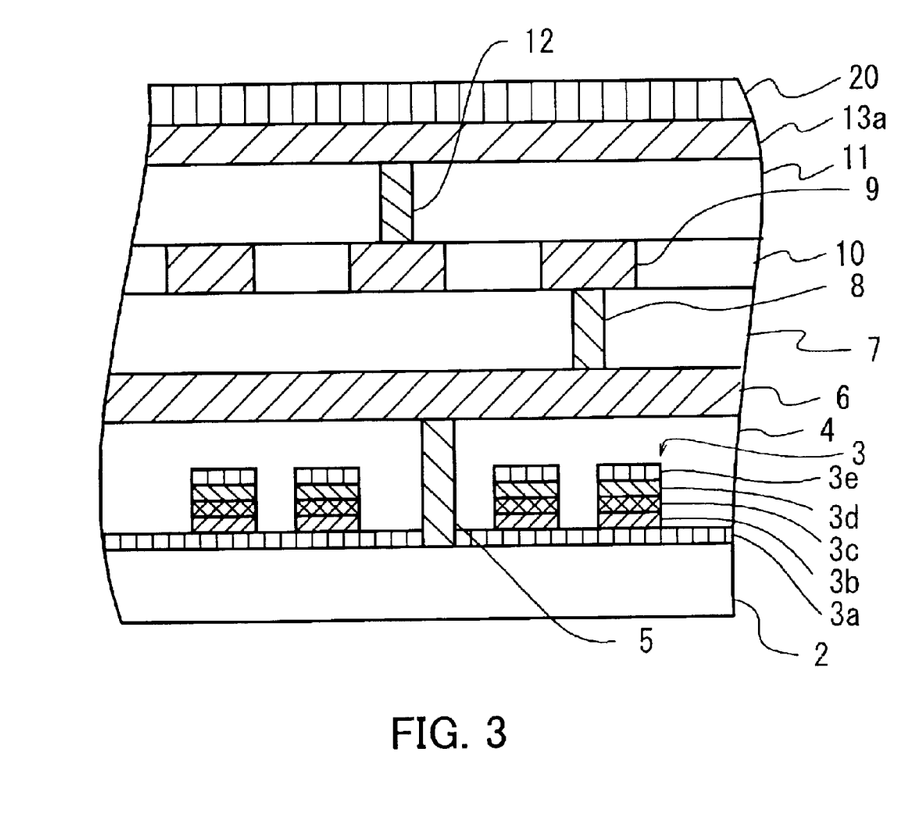
FIG. 3 is a view of a process following the process shown in FIG. 2 in which resist is coated for formation of wiring pattern.

FIG. 3 shows a process following the process shown in FIG. 2, in which resist is coated for forming interconnection or wiring pattern.

Resist 20 is coated on the metal interconnection substance 13a in order to shape it into the wiring pattern.

Figure 4:
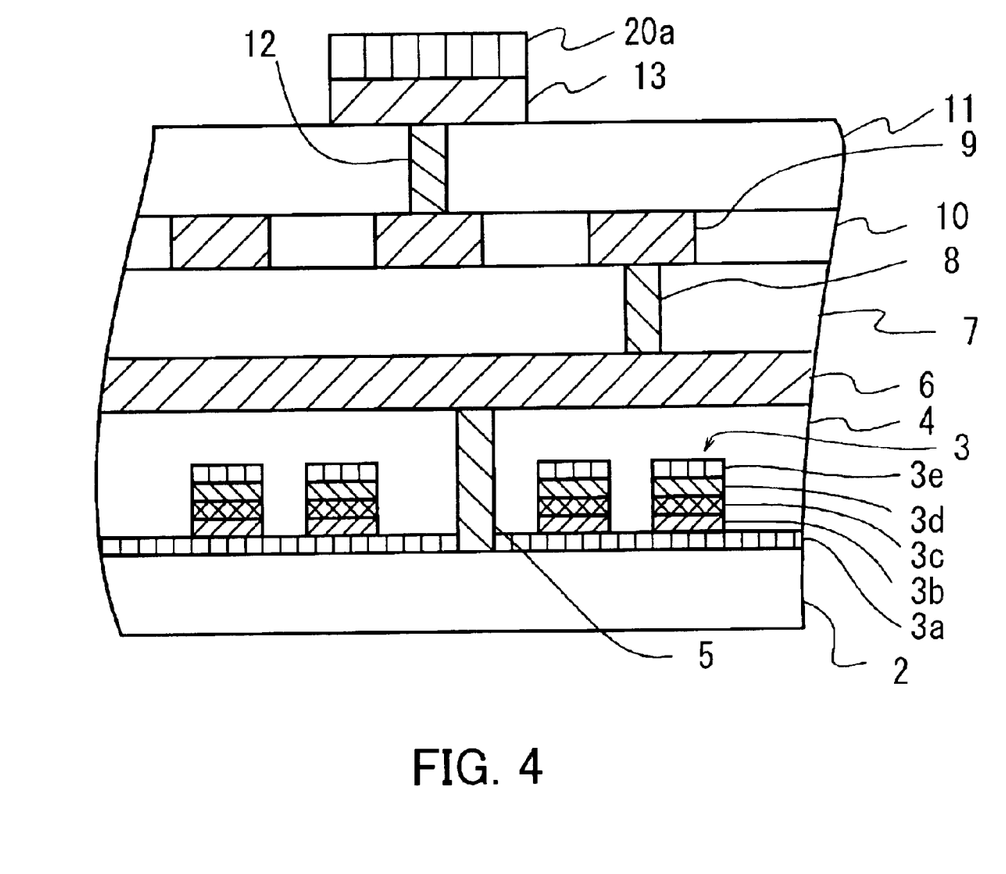
FIG. 4 is a view of a process following the process shown in FIG. 3 wherein the wiring pattern is exposed and is then etched.

FIG. 4 shows a process following the process in FIG. 3 in which the interconnection pattern is exposed and is then etched.

By the photolithography technique, the resist 20 shown in FIG. 3 is developed using mask so as to be formed into a desired pattern. Then, the metal interconnection substance 13a shown in FIG. 3 is etched with the resist pattern 20 used as mask, so that the structure shown in FIG. 4 can be defined. Etching may be RIE (Reactive Ion Etching) using Cl gas.

Figure 5:
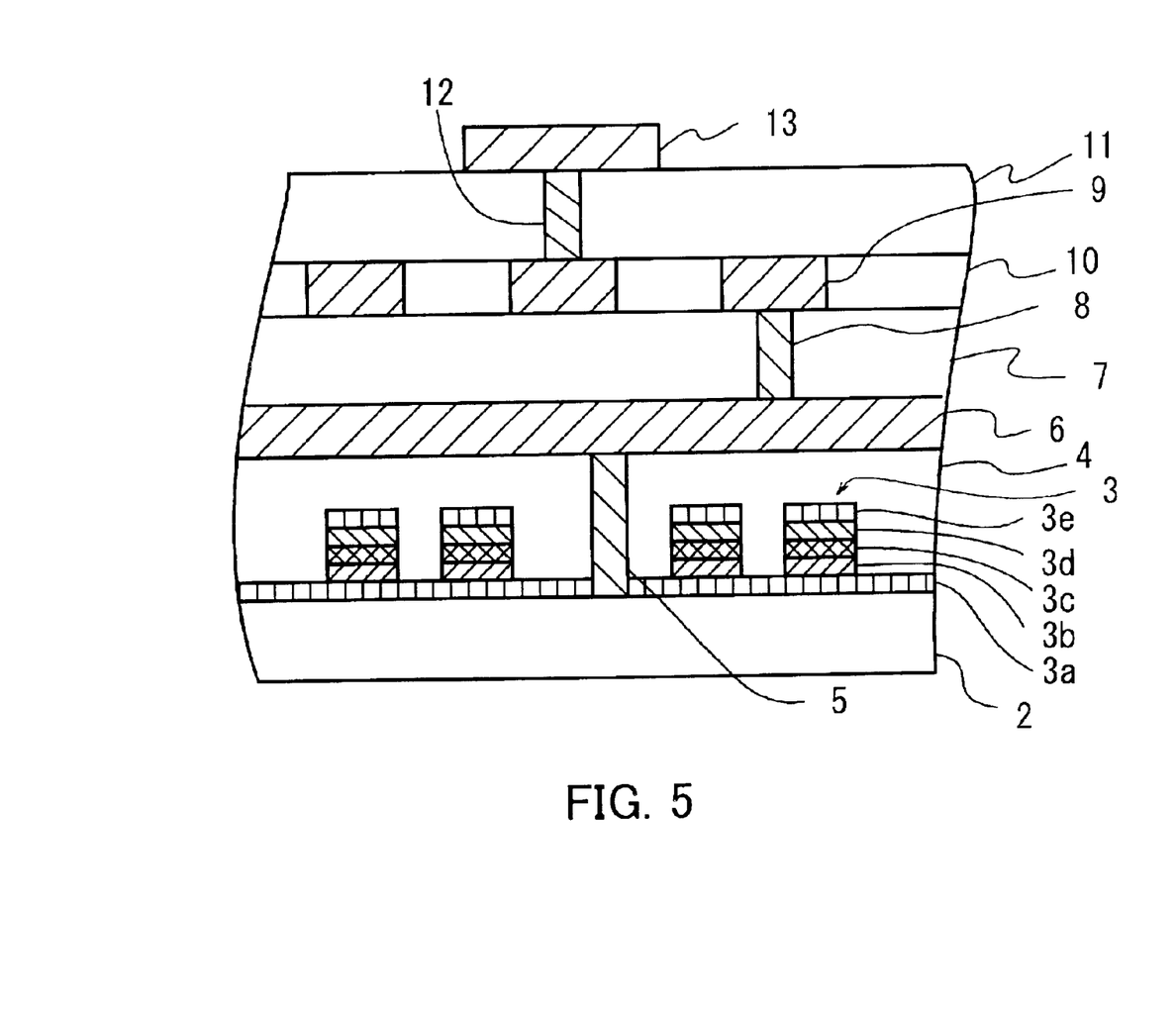
FIG. 5 is a view of a process following the process shown in FIG. 4 wherein resist is removed and a metal interconnection is formed.

FIG. 5 shows a process following the process shown in FIG. 4, in which the resist is removed and a metal interconnection is formed.

The resist pattern 20a used as mask at the time of etching in FIG. 4 is ashed by oxide-based plasma ashing. This results in the metal interconnection 13 shown in FIG. 5.

Figure 6:
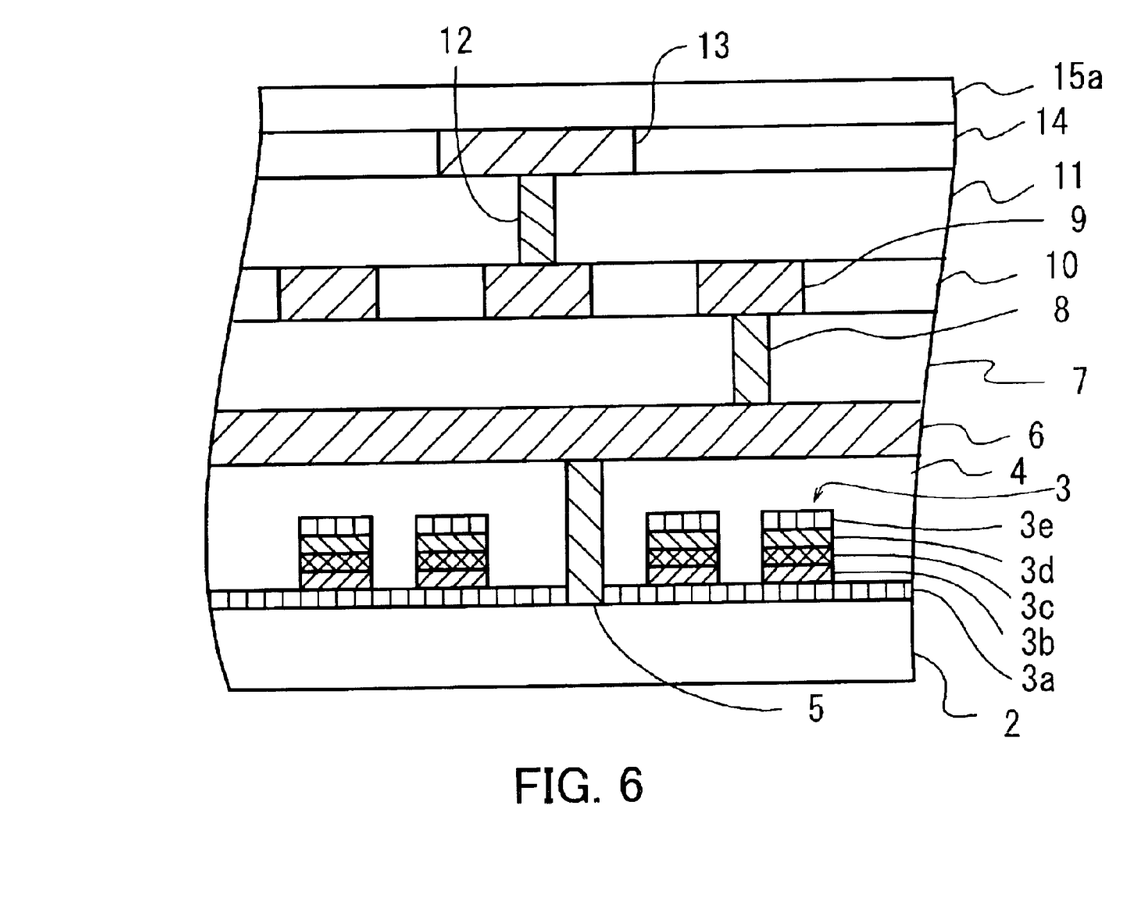
FIG. 6 is a view of a process following the process of FIG. 5 wherein a film for flattening and a passivation film are formed.

FIG. 6 shows a process following the process shown in FIG. 5, in which a flattening film and a passivation film are formed.

The flattening film 14 is formed so as to cover the metal interconnection 13 formed in the process of FIG. 5. The flattening film 14 may be a material having a relatively low relative permittivity such as SOG, HSQ or BPSG. The surface is flattened by CMP (Chemical Mechanical Polishing). A passivation film 15a made of silicon nitride is formed on the flattened surface for surface protection.

Figure 7:
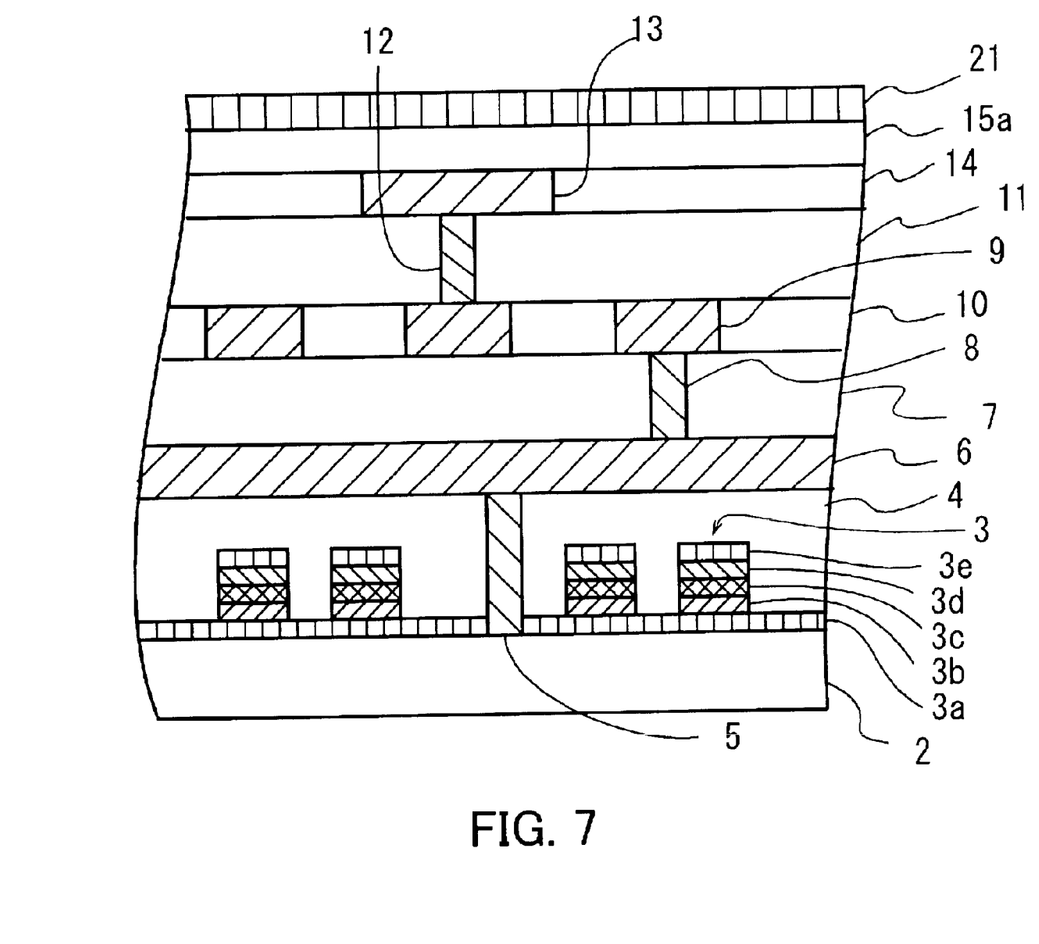
FIG. 7 is a view of a process following the process of FIG. 6 wherein resist for forming bonding pads is coated.

The process in FIG. 6 is followed by a process in FIG. 7, in which resist is coated for forming bonding pads.

Resist 21 is coated on the passivation film 15a for formation of the bonding pads.

Figure 8:
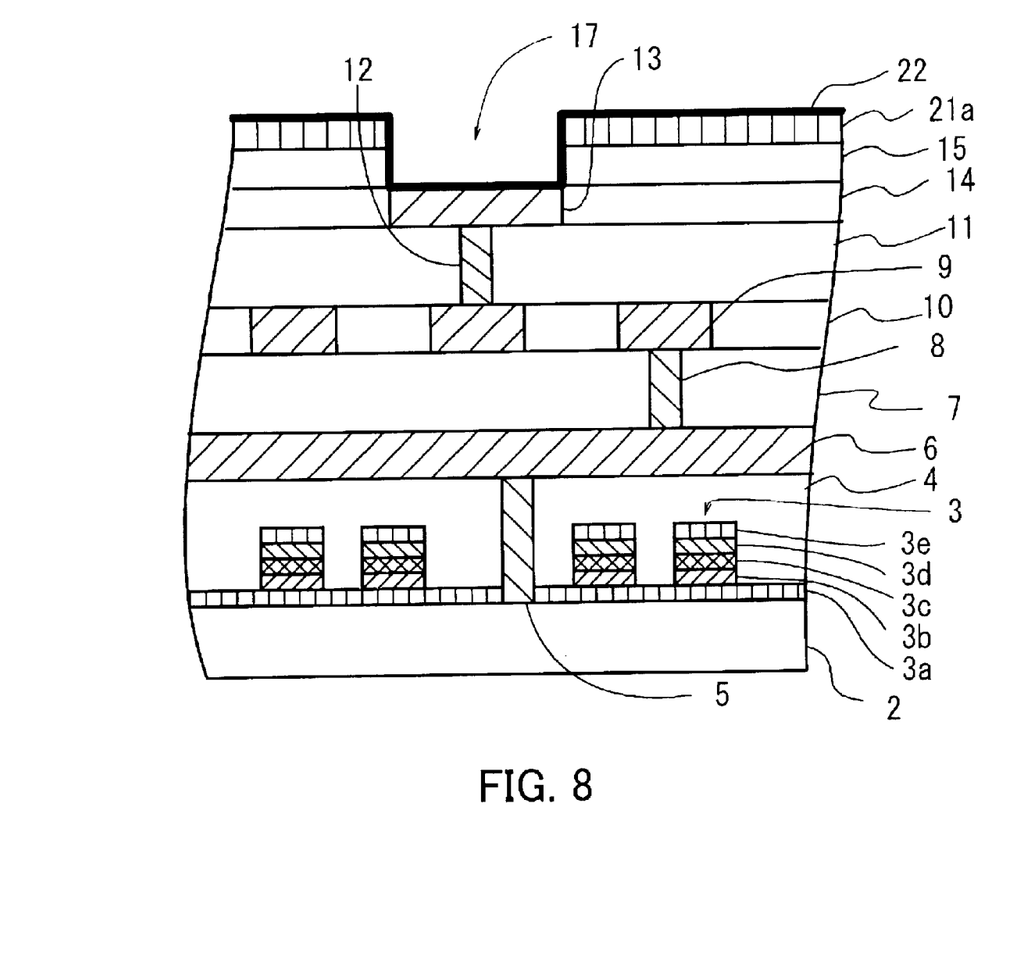
FIG. 8 is a view of a process following the process of FIG. 7 wherein the bonding pad part is etched.

FIG. 8 shows a process subsequent to that shown in FIG. 7, wherein the bonding pad part is etched.

Resist 21 in the structure shown in FIG. 7 is patterned into a resist pattern 21a. With the resist pattern 21a used as mask, the passivation film 15a is etched by RIE. The passivation film 15a thus etched is as shown in FIG. 8, in which the metal interconnection 13 is exposed so that the bonding pad part 17 can be defined. At that time, resist-hardened part 22 is defined by the surface of the metal interconnection 13, a sidewall of the etched part of the passivation film 15a, and the surface and sidewall of the resist pattern 21a.

Figure 9:
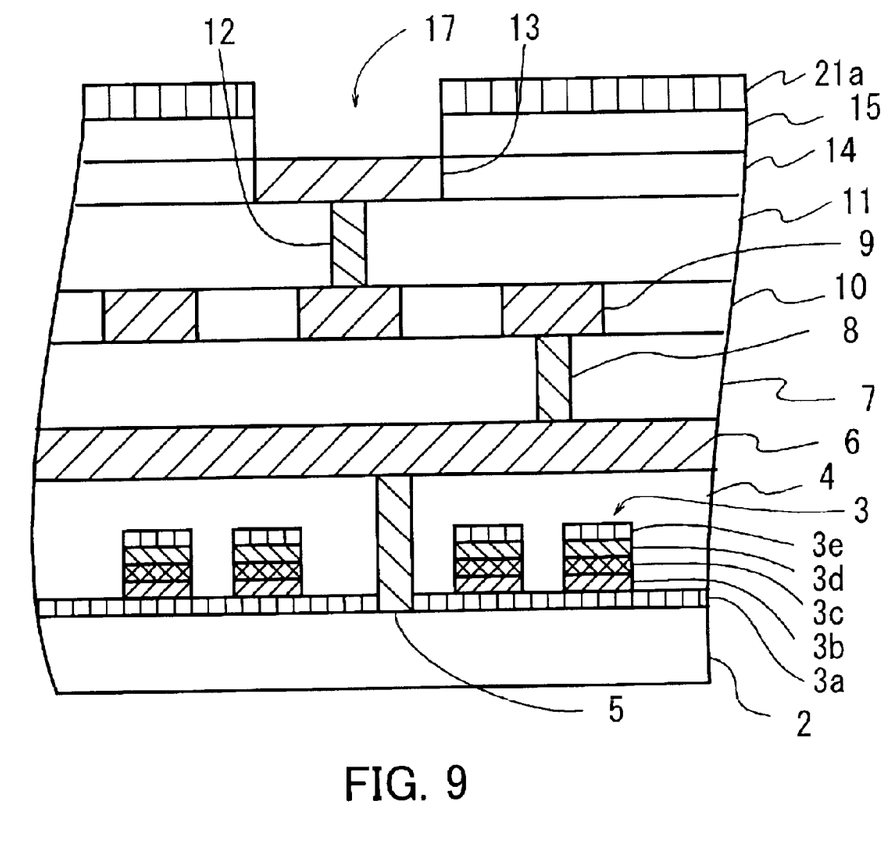
FIG. 9 is a view of a process following the process shown in FIG. 8 wherein a resist hardened part is removed by wet ashing.

FIG. 9 shows a process following that shown in FIG. 8, wherein the resist-hardened part is removed by wet ashing.

The resist-hardened part 22 is removed by wet ashing, and the structure shown in FIG. 9 is formed. Wet ashing is carried out by a spin wet scrubber. In wet ashing, a solution that contains hydroxylamine as the primary component. Since the above solution slightly contains corrosion element such as chlorine, the remainder of the solution is deposited on the surface of the metal interconnection 13 at the atom/molecule level.

Figure 10:
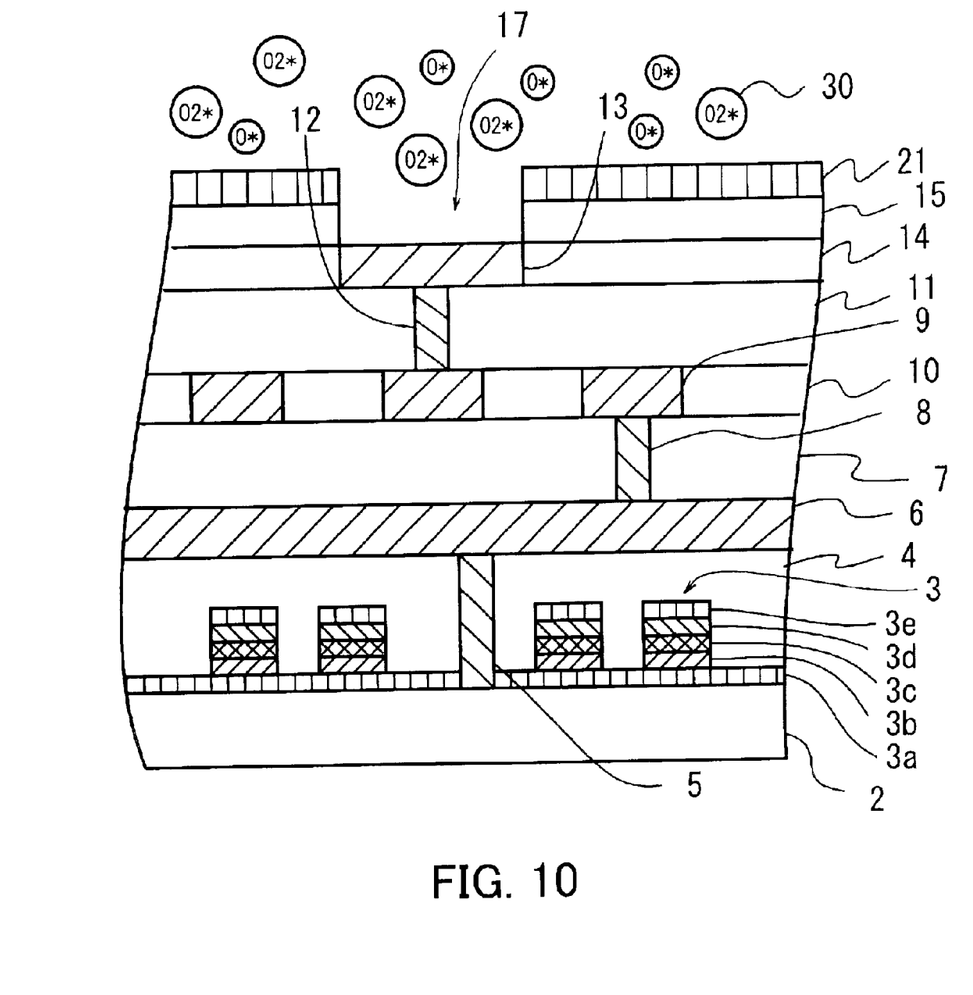
FIG. 10 is a view of a process following the process in FIG. 9 wherein oxygen gas based plasma ashing is performed.

FIG. 10 shows a process following that shown in FIG. 9, in which plasma ashing with oxygen gas is performed.

Plasma ashing is performed at a $O_2$ gas pressure of 1 Torr, a flow rate of 1000 sccm, an RF (Radio Frequency) power of 1 KW for an ashing time of 120 minutes.

Figure 11:
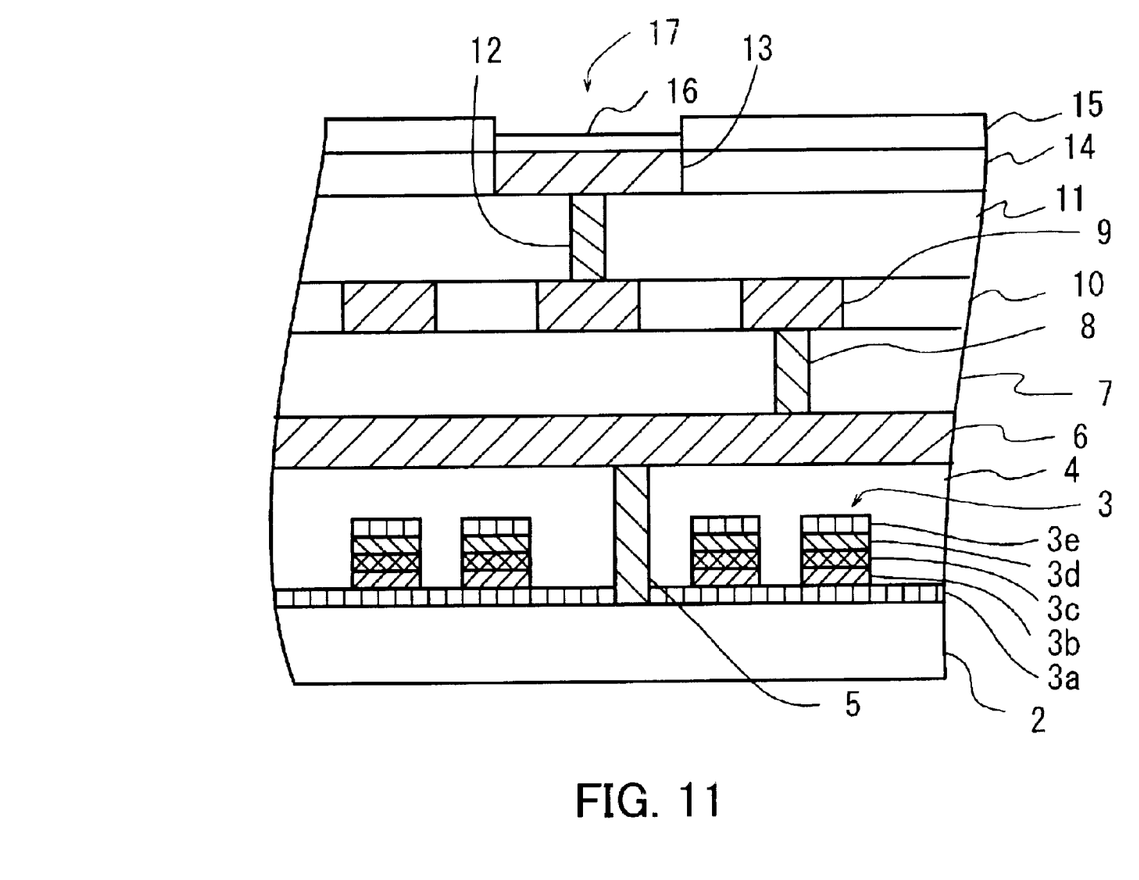
FIG. 11 is a view of a status after plasma ashing.

FIG. 11 shows a layer structure available after plasma ashing.

The resist 21 is completely removed, and the corrosion element such as chlorine deposited on the surface of the metal interconnection 13 is removed. In addition, the oxide film 16 is formed by oxidizing the metal interconnection 13 of aluminum. In the ashing condition, the aluminum oxide film 16 can be formed 30 angstrom thick.

Then, ultraviolet rays are irradiated from the bonding pad part 17 in order to erase the charges stored in the floating gate 3b. It is desired that the minimum illuminance of ultraviolet rays is 25 mW/cm$^2$, and the amount of illuminance is 108 W·sec/cm$^2$.

The following are the results of the secondary ion-mass spectrography for observation of the surface of the metal interconnection 13.

The secondary ion-mass spectrography is an analysis method for detecting secondary ions among ionized particles obtained by projecting a condensed high-speed ion beam onto the surface of a solid sample in vacuum and sputtering elements that exist in the sample surface. The secondary ion-mass spectrography is mainly used to analyze quantitative and qualitative analysis of an element that exists in the surface of a semiconductor sample. The spectrography is also used for analyzing the element density distribution in the depth direction by utilizing a phenomenon that the sample is milled by sputtering.

Figure 12A:
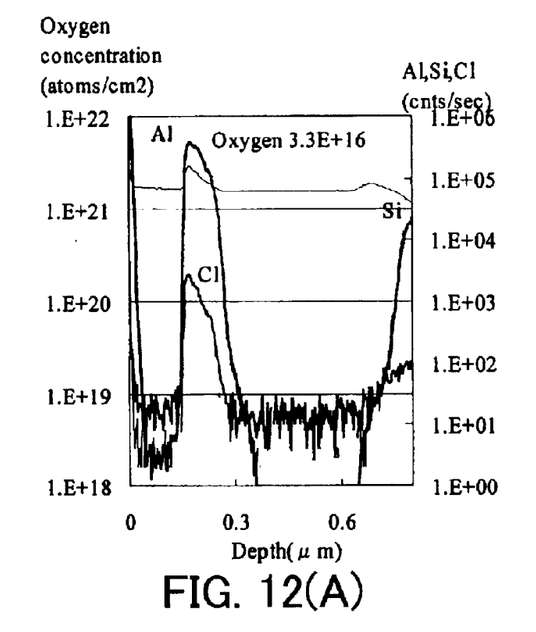
FIGS. 12(A) and 12(B) show the results of the secondary ion-mass analysis, wherein FIG. 12(A) relates to wet ashing following plasma ashing, and FIG. 12(B) relates to plasma ashing following wet ashing.
Figure 12B:
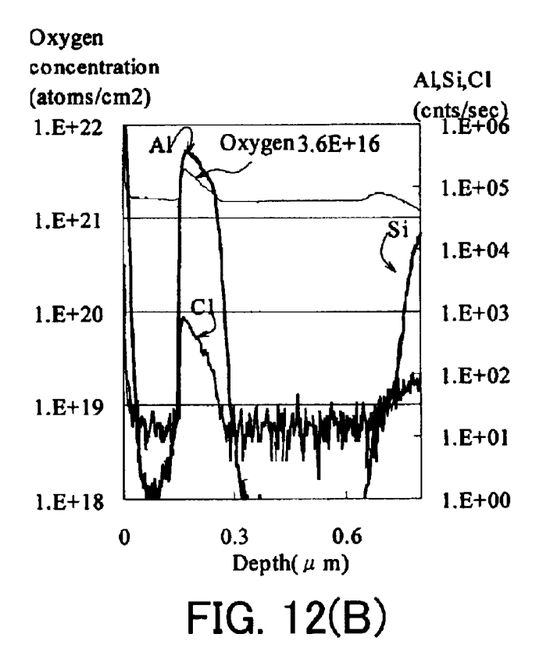

FIGS. 12(A) and 12(B) show the results of the secondary ion-mass analysis. More particularly, FIG. 12(A) relates to wet ashing following plasma ashing, and FIG. 12(B) relates to plasma ashing following wet ashing.

The samples used in the analysis related to FIG. 12(A) are those obtained by removing resist by performing plasma ashing and wet ashing in this order after the process shown in FIG. 8 is completed. The samples used in FIG. 12(B) are those obtained by the series of processes shown FIGS. 7 to 11.

The horizontal axes of FIGS. 12(A) and 12(B) denote depth. The right edges correspond to the surface of the silicon substrate, and the depth increases toward the left edges.

It can be seen from comparison between FIGS. 12(A) and 12(B) that a process-based difference appears in a depth of 1.5 $\mu$m to 3 $\mu$m.

The thickness of the aluminum oxide film formed from the secondary ion signal is 29 angstroms for FIG. 12(A) and 31 angstroms for FIG. 12(B). Thus, it is possible to form the oxide film 16 that is 3 nm thick or more.

The oxide film 16 having a thickness of 3 nm or more prevents occurrence of corrosion resulting irradiation of ultraviolet rays.

Further, the peak of Cl ion for FIG. 12(B) is smaller than that for FIG. 12(A). It is therefore possible to reduce the quantity of wet ashing solution and the quantity of Cl deposited from the atmosphere by performing wet ashing and plasma ashing in this order. It is expected that corrosion resulting from irradiation of ultraviolet rays for erasing of charges stored in the floating gate 3b be suppressed.

In the above description, the oxide coating film is formed by oxygen gas-based plasma ashing. When the metal interconnection 13 is made of aluminum, another ashing may be used. For example, high-temperature annealing in an environment containing oxygen gas may be employed. Any way can be employed that is capable of quickly forming the oxide film due to natural oxidization of the wafer that remains in the atmosphere. However, it is desirable to form the oxide film in conjunction with the resist removal process in the bonding pad part formation process since Cl ions and reaction products start to be deposited on the metal interconnection 13 immediately after the insulating film etching process in the bonding pad part formation process. This reduces the wasteful standby time and makes it possible to form the oxide film on the surface of the metal interconnection on which only a small quantity of impurity is deposited. Thus, occurrence of corrosion can be avoided effectively.

Aluminum used for the metal interconnection 13 may be replaced by a metal that contains a primary component of copper, which is a low resistance than and is superior to aluminum. Cu is likely to be corroded because of its chemical nature, as compared to Al. However, it is possible to prevent copper from being corroded by irradiation of ultraviolet rays by forming the oxide film on the surface by plasma ashing. In this case, the oxide film is a copper oxide film.

Similarly, Au, Pt or W may be used for the metal interconnection 13.

The present invention is not limited to plasma ashing for forming the oxide film 16, but includes a process of forming the oxide film 16 by ashing with oxygen.

The present invention is not limited to the aforementioned process of fabricating the semiconductor memory device having irradiation ultraviolet rays for erasing the charges stored in the floating gate 3b. For instance, the present invention may be applied to the process of irradiating ultraviolet rays for avoiding occurrence of corrosion in the process of fabricating a nonvolatile semiconductor memory device in which electrons are injected at the trap level in SiN while the gate insulating film of the MOSFET is formed by ONO ($SiO_2$/SiN/$SiO_2$).

A nitride coating film may be substituted for the oxide coating film 16 as the protection film formed on the metal interconnection 13.

It is also possible to employ a process of nitriding the surface of the metal interconnection substance in such a way as to expose the surface of the metallization in N* (nitrogen radical) atmosphere or a mixed atmosphere of N* and H* (hydrogen radical).

As described above, according to the present invention, the protection film is formed on the metal interconnection at the bonding pad part. It is therefore possible to prevent deposition of corrodent elements such as chlorine and fluorine that corrode the metal interconnection and deposition of chloride ions that facilitates occurrence of corrosion at the time of irradiating ultraviolet rays. Thus, occurrence of corrosion can be avoided.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method of fabricating a semiconductor memory device having a step of irradiating ultraviolet rays onto a metal interconnection at a bonding pad part and thus erasing charges stored in a charge storage part, the method further comprising the steps of:

forming a protection film on a surface of the metal interconnection; and irradiating the ultraviolet rays onto the protection film and thus erasing the charges, wherein the metal interconnection contains a primary component of aluminum, copper, gold, platinum or tungsten, and the protection film is an oxide film of aluminum, copper, gold, platinum or tungsten.

2. The method according to claim 1, wherein the protection film is 3.0 nm thick or more.

3. The method according to claim 1 or 2, further comprising the step of forming the protection film by dry ashing with oxygen gas.

4. The method according to claim 1 or 2, further comprising the step of forming the protection film by dry aching with oxygen gas after wet aching in a resist removal process at the time of forming the bonding pad part.

5. The method according to claim 3, wherein dry ashing is plasma ashing.

6. The method according to claim 1, further comprising the step of forming, on the metal interconnection with aluminum used as the primary component, the oxide film of aluminum by high-temperature annealing in an oxygen gas atmosphere.

7. A method of fabricating a semiconductor memory device having a step of irradiating ultraviolet rays onto a metal interconnection at a bonding pad part and thus erasing charges stored in a charge storage part, the method further comprising the steps of:

forming a protection film on a surface of the metal interconnection; and irradiating the ultraviolet rays onto the protection film and thus erasing the charges, wherein the metal interconnection has a primary component of aluminum, copper, gold, platinum or tungsten, and the protection film is a nitride film of aluminum, copper, gold, platinum or tungsten.

8. The method according to claim 7, further comprising the step of nitriding the metal interconnection in N* (nitrogen radical) atmosphere or a mixed atmosphere of N* and H* (hydrogen radical).

9. The method according to claim 4, wherein dry ashing is plasma ashing.

* * * * *